(12) United States Patent
Oyamada et al.

(10) Patent No.: US 9,490,398 B2
(45) Date of Patent: Nov. 8, 2016

(54) MANUFACTURING METHOD OF LIGHT EMITTING DEVICE IN A FLIP-CHIP CONFIGURATION WITH REDUCED PACKAGE SIZE

(71) Applicants: CITIZEN HOLDINGS CO., LTD., Nishitokyo-shi, Tokyo (JP); CITIZEN ELECTRONICS CO., LTD., Fujiyoshida-shi, Yamanashi (JP)

(72) Inventors: Nodoka Oyamada, Fujiyoshida (JP); Kenji Imazu, Fujiyoshida (JP); Shusaku Mochizuki, Fujiyoshida (JP)

(73) Assignees: CITIZEN HOLDINGS CO., LTD., Tokyo (JP); CITIZEN ELECTRONICS CO., LTD., Yamanashi (JP)

(*) Notice: Subject to any disclaimer, the term of this patent is extended or adjusted under 35 U.S.C. 154(b) by 0 days.

(21) Appl. No.: 14/650,787

(22) PCT Filed: Nov. 25, 2013

(86) PCT No.: PCT/JP2013/081660
§ 371 (c)(1),
(2) Date: Jun. 9, 2015

(87) PCT Pub. No.: WO2014/091914
PCT Pub. Date: Jun. 19, 2014

(65) Prior Publication Data
US 2015/0311405 A1    Oct. 29, 2015

(30) Foreign Application Priority Data

Dec. 10, 2012 (JP) .................................. 2012-269210
Jan. 11, 2013 (JP) .................................. 2013-003290

(51) Int. Cl.
*H01L 33/50* (2010.01)
*H01L 33/60* (2010.01)
(Continued)

(52) U.S. Cl.
CPC ............... *H01L 33/50* (2013.01); *H01L 33/36* (2013.01); *H01L 33/60* (2013.01); *H01L 33/486* (2013.01);
(Continued)

(58) Field of Classification Search
CPC ........ H01L 33/50; H01L 33/36; H01L 33/60; H01L 33/486
See application file for complete search history.

(56) References Cited

U.S. PATENT DOCUMENTS 8,183,585 B2   5/2012  Scotch
8,552,444 B2  10/2013  Ide
(Continued)

FOREIGN PATENT DOCUMENTS

JP    2002368286    12/2002
JP    2004354534    12/2004
(Continued)

OTHER PUBLICATIONS

International Search Report mailed Dec. 17, 2013 for International Application No. PCT/JP2013/081660.
(Continued)

*Primary Examiner* — Minh-Loan Tran
*Assistant Examiner* — Farid Khan
(74) *Attorney, Agent, or Firm* — Ratnerprestia

(57) ABSTRACT

Provided is an LED device which is compact while having good luminous efficiency and a focused light distribution. This LED device is provided with: a reflective frame around the outer periphery of the LED device; an LED die which has a transparent insulating substrate, a semiconductor layer formed on the bottom surface of the transparent insulating substrate, and an outer connection electrode disposed on the semiconductor layer; and a fluorescent member which is disposed on at least the top surface of the LED die and which converts the wavelength of the light emitted from the LED die. On the inside of the reflective frame is an inclined surface in contact with the lateral surface of the fluorescent member, and the inclined surface is formed such that the inner diameter of the reflective frame widens from the bottom surface towards the top surface of the LED die. Also provided is a manufacturing method of the LED device.

3 Claims, 10 Drawing Sheets

(51) Int. Cl.
*H01L 33/36* (2010.01)
*H01L 33/48* (2010.01)

(52) U.S. Cl.
CPC .... *H01L 2224/13* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 8,556,672 B2 | 10/2013 | Imazu | |
| 9,024,340 B2 | 5/2015 | Minato | |
| 2008/0290351 A1* | 11/2008 | Ajiki | H01L 25/0753 257/88 |
| 2010/0258830 A1* | 10/2010 | Ide | H01L 24/97 257/98 |
| 2010/0264438 A1* | 10/2010 | Suenaga | H01L 33/58 257/98 |
| 2010/0320479 A1* | 12/2010 | Minato | H01L 33/505 257/88 |
| 2011/0084300 A1* | 4/2011 | Park | H01L 33/508 257/98 |
| 2011/0266560 A1* | 11/2011 | Yao | H01L 33/505 257/88 |
| 2012/0286301 A1* | 11/2012 | Kobayakawa | H01L 33/54 257/88 |
| 2012/0302124 A1* | 11/2012 | Imazu | H01L 33/486 445/58 |
| 2014/0054621 A1* | 2/2014 | Seko | H01L 33/505 257/88 |
| 2014/0054623 A1* | 2/2014 | Inoue | H01L 33/60 257/88 |

FOREIGN PATENT DOCUMENTS

| | | |
|---|---|---|
| JP | 2010141176 | 6/2010 |
| JP | 2011258665 | 12/2011 |
| JP | 2012503332 | 2/2012 |
| JP | 2012227470 | 11/2012 |
| WO | 2009066430 | 5/2009 |
| WO | 2009069671 | 6/2009 |
| WO | 2011093454 | 8/2011 |

OTHER PUBLICATIONS

International Preliminary Report and Translation of PCT/JP2013/081660 Issued June 25, 2015.

* cited by examiner

MANUFACTURING METHOD OF LIGHT EMITTING DEVICE IN A FLIP-CHIP CONFIGURATION WITH REDUCED PACKAGE SIZE

CROSS REFERENCE TO RELATED APPLICATIONS

This is the U.S. National Phase application of PCT/JP2013/081660, filed Nov. 25, 2013, which claims priority to Japanese Patent Application No. 2012-269210, filed Dec. 10, 2012, Japanese Patent Application No. 2013-003290, filed Jan. 11, 2013, the disclosures of these applications being incorporated herein by reference in their entireties for all purposes.

TECHNICAL FIELD OF THE INVENTION

The present invention relates to an LED device that lends itself to chip size packaging, and a method for manufacturing the same.

BACKGROUND OF THE INVENTION

With an increasing demand for higher brightness, the size of LED dies as bare chips has also been increasing, and nowadays, LED dies measuring up to 1 mm by 0.5 to 1 mm in area size are commercially available. Since this area size is about the same as that of other chip components such as resistors, there has developed a need for an LED device constructed by packaging an LED die with a resin or the like to have about the same area size as the LED die itself. Such a package is sometimes referred to as a chip size package (hereinafter abbreviated CSP) as it directly reflects the size of the LED die. A CSP has the advantage of small mounting area and a reduced amount of packaging material. It has the further advantage of being able to provide greater freedom in the design of lighting equipment, etc., because the number of components to be mounted on the mother substrate can be easily changed according to the required brightness.

FIG. 13 is a cross-sectional view of a light-emitting device 100 (LED device) implemented in CSP form according to a first prior art example.

The light-emitting device 100 shown in FIG. 13 is an ultimate form of CSP in which the chip size of the LED die is identical with the outer plan shape of the package, and this LED device is disclosed in patent document 1.

In the LED device 100, a phosphor layer 130 and a lens 132 are formed one on top of the other on the upper surface of a multilayered structure 112c (of semiconductor layers). Seed metals 122a and 122b remaining unetched when a common electrode was formed by electrolytic plating, copper wiring layers 124a and 124b, and columnar copper pillars 126a and 126b formed by electrolytic plating are located on the underside of the multilayered structure 112c.

The multilayered structure 112c is made up of a p-type clad layer 112a, a light-emitting layer 112e, and an n-type clad layer 112b. The lower surface of the multilayered structure 112c is covered with an insulating layer 120 having openings in designated portions. Solder balls 136a and 136b are attached to the bottoms of the respective copper pillars 126a and 126b. A reinforcing resin 128 is filled into the space separating the copper pillars 126a and 126b.

The area size of the LED device 100 shown in FIG. 13 is identical with the area size of the multilayered structure 112c. The LED device 100 is one that is diced from a wafer on which a plurality of LED devices 100 are formed in a rectangular array; such a package is the smallest one among the group of products categorized as CSPs, and is therefore sometimes referred to as a wafer-level package (WLP). In the LED device 100, since the transparent insulating substrate initially present on the multilayered structure 112c (see FIG. 2 and paragraph 0026 in patent document 1) has been removed, light emitted from the light-emitting layer 112e is allowed to emerge only in the upward direction (arrow B). Therefore, the phosphor layer 130 need only be provided on the upper surface of the LED device 100.

In the LED device 100 of FIG. 13, a laser is used to remove the transparent insulating substrate, but this requires large-scale manufacturing equipment and increases the complexity of the manufacturing process. Furthermore, since the phosphor layer 130 is formed on the LED device 100 at the wafer level, it is not possible to address variations in light emission characteristics arising among the individual LED dies produced on the wafer. This leads to the problem that it is difficult to manage the color of emission.

In view of the above problem, the present inventor experimentally produced a flip-chip LED device as an LED device that is compact in size and yet easy to manufacture and whose color of emission is easy to manage; to achieve this, the transparent insulating substrate was left unremoved, and the side faces of the transparent insulating substrate as well as the side faces of the semiconductor layer formed on the lower surface of the transparent insulating substrate were covered with a reflective resin, while the upper surface of the transparent insulating substrate and the upper ends of the reflective resin were covered with a phosphor sheet (refer to patent document 2).

FIG. 14 is a cross-sectional view of an LED device 200 according to a second prior art example. The LED device 200 shown here is disclosed in patent document 2.

The LED device 200 is constructed from an LED die 216b having a sapphire substrate 214b (transparent insulating substrate) and a semiconductor layer 215b formed on the lower surface thereof, and includes a white reflective member 217b formed on the side faces of the LED die 216b, and a phosphor sheet 211b, formed on the upper surface of the LED die 216b including the white reflective member 217b, for wavelength conversion of emitted light. An adhesive layer 213b is interposed between the phosphor sheet 211b and the sapphire substrate 214b which are thus bonded together. Protruding electrodes 218b and 219b, which are connected to the semiconductor layer 215b of the LED die 216b, are an anode and a cathode, respectively, and serve as external connecting electrodes for connecting to a mother substrate. The mother substrate is the substrate on which the LED device 200 is mounted along with other electronic components such as resistors and capacitors.

Since the phosphor sheet 211b can be selected and changed according to the light emission characteristics of the individual LED die 216b, the color of emission of the LED device 200 is easy to manage. Further, since the white reflective member 217b can serve the purpose if its thickness is reduced to 100 μm or less, the LED device 200 can be made compact in size. Furthermore, the LED device 200 is easy to manufacture, because a batch manufacturing method can be employed in which processing is performed on a large number of LED dies 216b arranged in an array on a wafer which is eventually diced into individual LED devices 200.

PATENT DOCUMENTS

Patent document 1: Japanese Unexamined Patent Publication No. 2010-141176
Patent document 2: Japanese Unexamined Patent Publication No. 2012-227470

SUMMARY OF THE INVENTION

Possible application of the above LED 200 include a camera flash lamp. However, compared with a flash lamp that needs only illuminate the shooting range, the LED device 200 that emits much of the light from the side faces of the phosphor sheet 211*b* has been unable to provide a sufficient amount of light to illuminate the shooting area. The LED device 200 is therefore not suited for applications where a limited area needs to be illuminated with bright light.

An object of the present invention is to provide an LED device that is compact in size and yet has a good light-emitting efficiency and is capable of providing a confined light distribution, and a method for manufacturing such an LED device.

An LED device includes a reflective frame formed around an outer periphery of the LED device; an LED die having a transparent insulating substrate, a semiconductor layer formed on a lower surface of the transparent insulating substrate, and an external connecting electrode formed on the semiconductor layer; and a phosphor member, disposed at least on an upper side of the LED die, for wavelength-converting light emitted from the LED die, wherein an inner wall of the reflective frame is provided with a sloping face which is in contact with a side face of the phosphor member, and the sloping face is formed so that an inside diameter of the reflective frame becomes larger from a lower side of the LED die toward the upper side thereof.

When the LED device is placed with its external connecting electrode face down, the phosphor member is located on the upper side of the LED die. The phosphor member is enclosed by the reflective frame whose inner wall is provided with a sloping face which is formed so that the inside diameter becomes larger from the lower side toward the upper side. Stated another way, the reflective frame is in contact with the side portions of the phosphor member, and becomes larger in thickness toward the lower end of the sloping face. Since the phosphor member and the reflective frame are integrated with the LED die having the external connecting electrode, the structure of the LED device can be easily made compact in size. Further, light trying to propagate in lateral directions is reflected by the sloping face of the reflective frame and thus redirected upward in an efficient manner. This serves to improve the light emission efficiency. This also serves to confine the light distribution in a narrow range because there is no light radiating from the side faces of the LED device.

Preferably, in the LED device, a bottom face on the lower side of the LED die and a lowermost end of the sloping face on the lower side of the LED die are at substantially the same position, and the phosphor member is disposed in a gap created between the sloping face and a side face of the LED die.

Preferably, in the LED device, the bottom face on the lower side of the LED die and the lowermost end of the sloping face on the lower side of the LED die are at substantially the same position, and an optically transmissive member or another phosphor member other than the phosphor member is disposed in the gap created between the sloping face and the side face of the LED die.

Preferably, in the LED device, the phosphor member is a phosphor sheet, and the phosphor sheet is bonded to an upper face of the LED die.

Preferably, in the LED device, the reflective frame is formed from a reflective resin.

Preferably, in the LED device, the bottom face on the lower side of the LED die is covered with the reflective resin except a region where the external connecting electrode is formed.

Preferably, in the LED device, the inner wall of the reflective frame is provided with a planar portion in addition to the sloping face, and the planar portion covers the side face of the LED die.

Preferably, in the LED device, the inner wall of the reflective frame is provided, on the upper side of the LED die, with a face formed perpendicular to the bottom face on the lower side of the LED die, and the inner wall of the reflective frame is provided, on the lower side of the LED die, with the sloping face.

A method for manufacturing an LED device having a reflective frame formed around an outer periphery thereof, an LED die, and a phosphor member for wavelength-converting light emitted from the LED die, includes, a placement step for placing the LED die on a first support sheet in such a manner that an external connecting electrode provided on a lower side of the LED die faces down, a phosphor member applying step for applying the phosphor member so as to cover upper and side faces of the LED die, a groove forming step for bonding a second support sheet to an upper surface of the phosphor member on an upper side of the LED die and for forming a groove for separating the LED die by applying a V-shaped blade from a bottom side of the phosphor member, a reflective resin filling step for filling a reflective resin into the groove; and a dicing step for dicing to separate the LED device by cutting the reflective resin.

In the LED device manufacturing method, since the reflective frame formed from the reflective resin is subjected to the step of filling the reflective resin into the V-shaped groove, the reflective frame is provided with a sloping face on its inner wall. With the provision of the sloping face, light trying to propagate in lateral directions is reflected upward, and the reflected light propagates through the gap created between the reflective frame and the side face of the LED die and emerges from the upper face of the LED device. This serves to improve the light emission efficiency. This also serves to confine the light distribution in a narrow range because there is no light radiating from the side faces of the LED device.

Preferably, in the groove forming step of the LED device manufacturing method, first a groove having a rectangular cross section is formed in the phosphor member, and then the V-shaped blade is applied from the bottom side of the phosphor member to form a sloping face on a portion of the rectangular cross-section groove, thereby forming a groove that has a sloping face on the bottom side.

An alternative method for manufacturing an LED device having a reflective frame formed around an outer periphery thereof, an LED die, and a phosphor member for wavelength-converting light emitted from the LED die, includes, a placement step for placing the LED die on a large-sized phosphor sheet in such a manner that an external connecting electrode provided on a lower side of the LED die faces down, an optically transmissive member filling step for filling an optically transmissive member or a phosphor member different from the phosphor sheet into a gap separating the LED die, a groove forming step for forming a groove for separating the LED die by applying a V-shaped blade so as to cut through the optically transmissive member or the phosphor member different from the phosphor sheet until reaching the phosphor sheet; a reflective resin filling step for filling a reflective resin into the groove, and a dicing step for dicing to separate the LED device by cutting the reflective resin.

In the alternative LED device manufacturing method, since the reflective frame formed from the reflective resin is subjected to the step of filling the reflective resin into the V-shaped groove, the reflective frame is provided with a sloping face on its inner wall. With the provision of the sloping face, light trying to propagate in lateral directions is reflected upward, and the reflected light propagates through the gap created between the reflective frame and the side face of the LED die and emerges from the upper face of the LED device. This serves to improve the light emission efficiency. This also serves to confine the light distribution in a narrow range because there is no light radiating from the side faces of the LED device.

In the above LED device, since the phosphor member and the reflective frame are integrated with the LED die having the external connecting electrode, the structure of the LED device can be easily made compact in size, and the provision of the sloping face on the inner wall of the reflective frame serves not only to improve the light emission efficiency but also to confine the light distribution in a narrow range.

The above LED device manufacturing method employs the batch manufacturing method, forms the V-shaped groove between each LED die, and fills the reflective resin into the groove to form the reflective frame which, when separated by dicing, is provided with a sloping face on its inner wall. In the thus obtained LED device, since the phosphor member and the reflective frame are integrated with the LED die having the external connecting electrode, the structure of the LED device can be easily made compact in size, and the provision of the sloping face on the inner wall of the reflective frame serves not only to improve the light emission efficiency but also to confine the light distribution in a narrow range.

DETAILED DESCRIPTION OF EMBODIMENTS OF THE INVENTION

Figure 1:
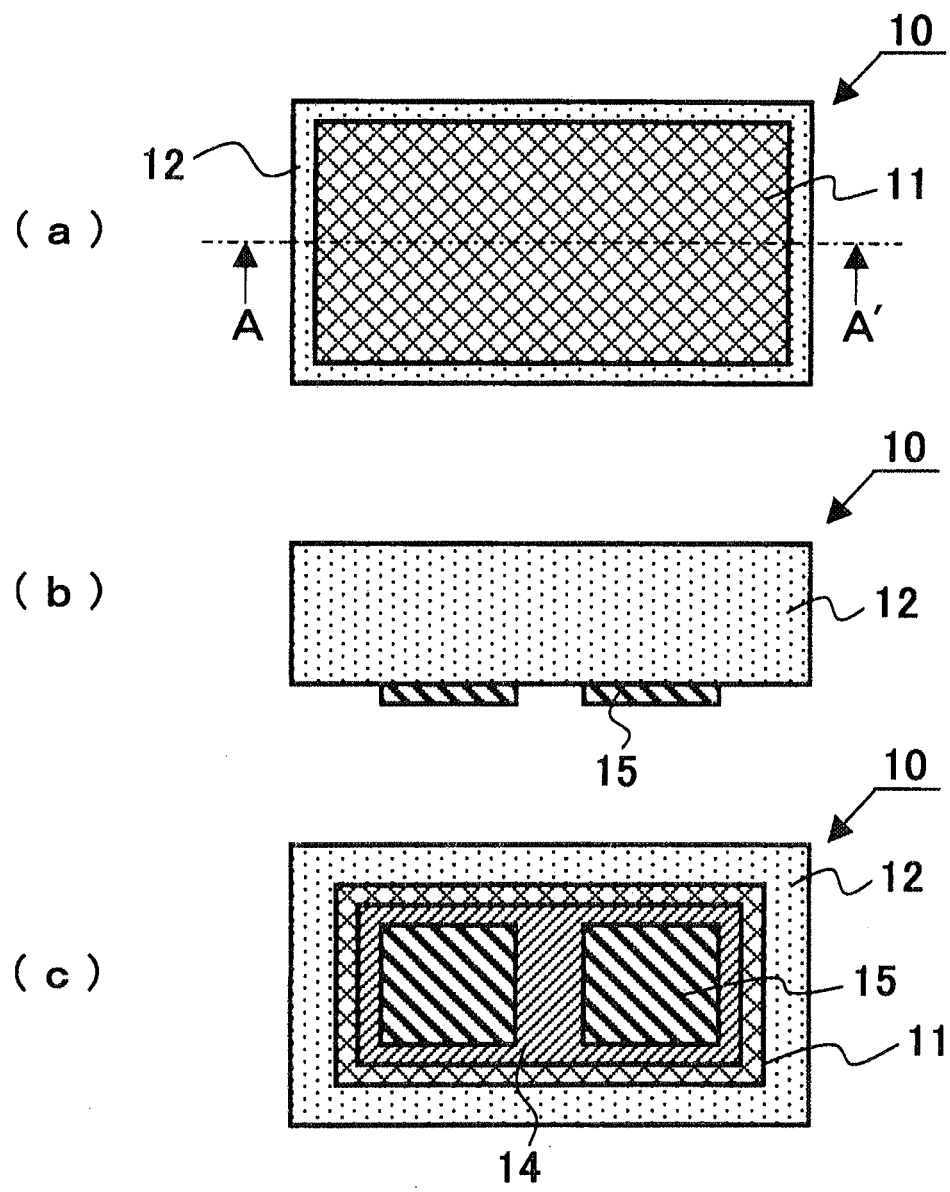
FIG. 1 is a diagram showing the external appearance of an LED device 10.

Preferred embodiments of the present invention will be described in detail below with reference to the drawings. It will, however, be noted that the technical scope of the present invention is not limited by any particular embodiment described herein but extends to the inventions described in the appended claims and their equivalents. Further, throughout the drawings, the same or corresponding component elements are designated by the same reference numerals, and the description of such component elements, once given, will not be repeated thereafter. It will also be noted that the scale of the component elements is changed as necessary for illustrative purposes.

FIG. 1 shows the external appearance of an LED device 10; more specifically, FIG. 1(a) shows a plan view, FIG. 1(b) shows a front view, and FIG. 1(c) shows a bottom view.

As shown in FIG. 1(a), when the LED device 10 is viewed from the top, a rectangular reflective frame 12 and a phosphor member 11 enclosed therein are seen. As shown in FIG. 1(b), when the LED device 10 is viewed from the front, two external connecting electrodes 15 are seen protruding downward from the underside of the reflective frame 12. As shown in FIG. 1(c), when the LED device 10 is viewed from the bottom, the rectangular reflective frame 12 and the phosphor member 11 enclosed therein are seen along with a semiconductor layer 14 and the two external connecting electrodes 15 formed in regions within the semiconductor layer 14. As can be seen from a comparison between FIGS. 1(a) and 1(c), the width of the reflective frame 12 is greater in FIG. 1(c) because the inner wall of the reflective frame 12 is provided with a sloping face as will be described later.

Figure 2:
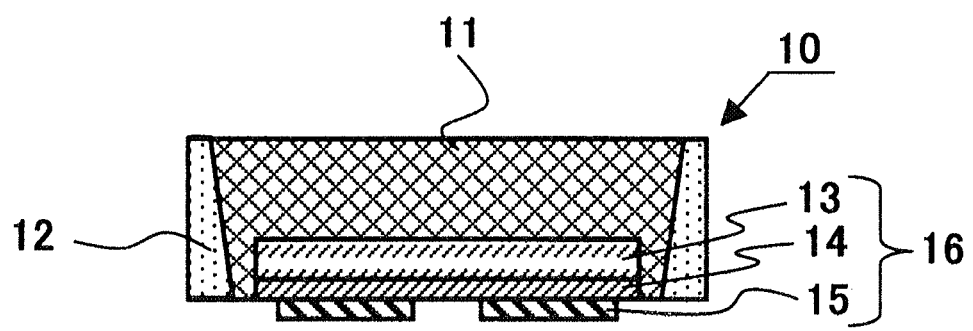
FIG. 2 is a cross-sectional view of the LED device 10 taken along line AA' in FIG. 1.

FIG. 2 is a cross-sectional view taken along line AA' in FIG. 1(a).

As shown in FIG. 2, the LED device 100 includes the reflective frame 12 formed around the outer periphery, an LED die 16, and the phosphor member 11 for wavelength-converting light emitted from the LED die 16. The LED die 16 includes a sapphire substrate 13 as a transparent insulating substrate and the semiconductor layer 14 formed on the lower surface of the sapphire substrate 13. The semiconductor layer 14 includes the two external connecting electrodes 15. The phosphor member 11 formed inside the reflective frame 12 covers the upper and side faces of the LED die 16. The inner wall of the reflective frame 12 is sloped as shown.

The phosphor member 11 is formed by mixing fine phosphor particles into a silicone resin and by kneading and curing the mixture, and has a thickness of about 100 to 300 μm. Alternatively, the phosphor member 11 may be a phosphor glass or a phosphor plate formed by sintering phosphors. If it is desired to reduce loss due to concentration quenching, the phosphor concentration in the phosphor member should be reduced, and the phosphor member 11 should be formed thicker. The phosphor member 11 has the function of wavelength-converting the blue light of the LED die 16 into white light.

The reflective frame 12 is formed from a reflective resin prepared by mixing fine reflective particles such as titanium oxide or alumina into a binder such as a silicone resin or organopolysiloxane and by kneading and thermally curing the mixture, and has a width of 50 to 100 μm. Because of the provision of the reflective frame 12, if the area size of the LED die 16 is 0.8 mm×0.3 mm, then the area size of the LED device 10 is about 1.1 mm×0.6 mm, thus making the overall size easy to handle by a surface mounter.

The sapphire substrate 13 of the LED die 16 is about 80 to 120 μm in thickness. The semiconductor layer 14 formed on the lower surface of the sapphire substrate 13 is about 10 μm in thickness and includes a p-type semiconductor layer and an n-type semiconductor layer, and the junction between them serves as the light-emitting layer. An interlayer insulating film and a protective film are formed on the underside of the semiconductor layer 14, and the external connecting electrodes 15 are formed on the protective film. The two external connecting electrodes 15 are an anode and a cathode, respectively, and are connected to the p-type semiconductor layer and the n-type semiconductor layer via interconnections formed on the interlayer insulating film. The external connecting electrodes 15 are electrodes, with a thickness of several hundreds of nanometers to several tens of micrometers, for connecting to a mother substrate on which other electronic components such as resistors and capacitors are mounted, and each electrode has a gold or tin layer on its surface for soldering.

As described earlier, in the LED device 10, the side faces of the LED die 16 are separated from the reflective frame 12 by the phosphor member 11 filled between them. If the side faces of the LED die 16 were in contact with the reflective frame 12, light trying to emerge from the side faces of the sapphire substrate 13 would be reflected back into the sapphire substrate 13. The light reflected back into the sapphire substrate 13 would be attenuated due to reflection loss or by being reabsorbed by the semiconductor layer 14, and the light emission efficiency of the LED device would decrease.

In the LED device 10, the phosphor member 11 is interposed between the reflective frame 12 and the side faces of the LED die 16. As a result, most of the light emitted from the side faces of the LED die 16, passed through the phosphor member 11, and reflected by the reflective frame 12 (though a portion of the light may be reflected back into the sapphire substrate 13) propagates upward through the phosphor member 11 interposed between the reflective frame 12 and the side faces of the LED die 16 and is emitted from the LED device 10. This reduces the reflection loss or the amount of light reabsorbed by the semiconductor layer 14, and as a result, the light emission efficiency increases. Furthermore, since the reflective frame 12 blocks the light directed toward the side faces of the LED device, the light distribution is confined in a narrow range. The sloping face of the reflective frame 12 is formed so as to be in contact with the phosphor member 11 so that the inside diameter of the reflective frame 12 (the distance between the left and right sides of the reflective frame 12) becomes larger from the lower side toward the upper side of the LED die 16.

Figure 3:
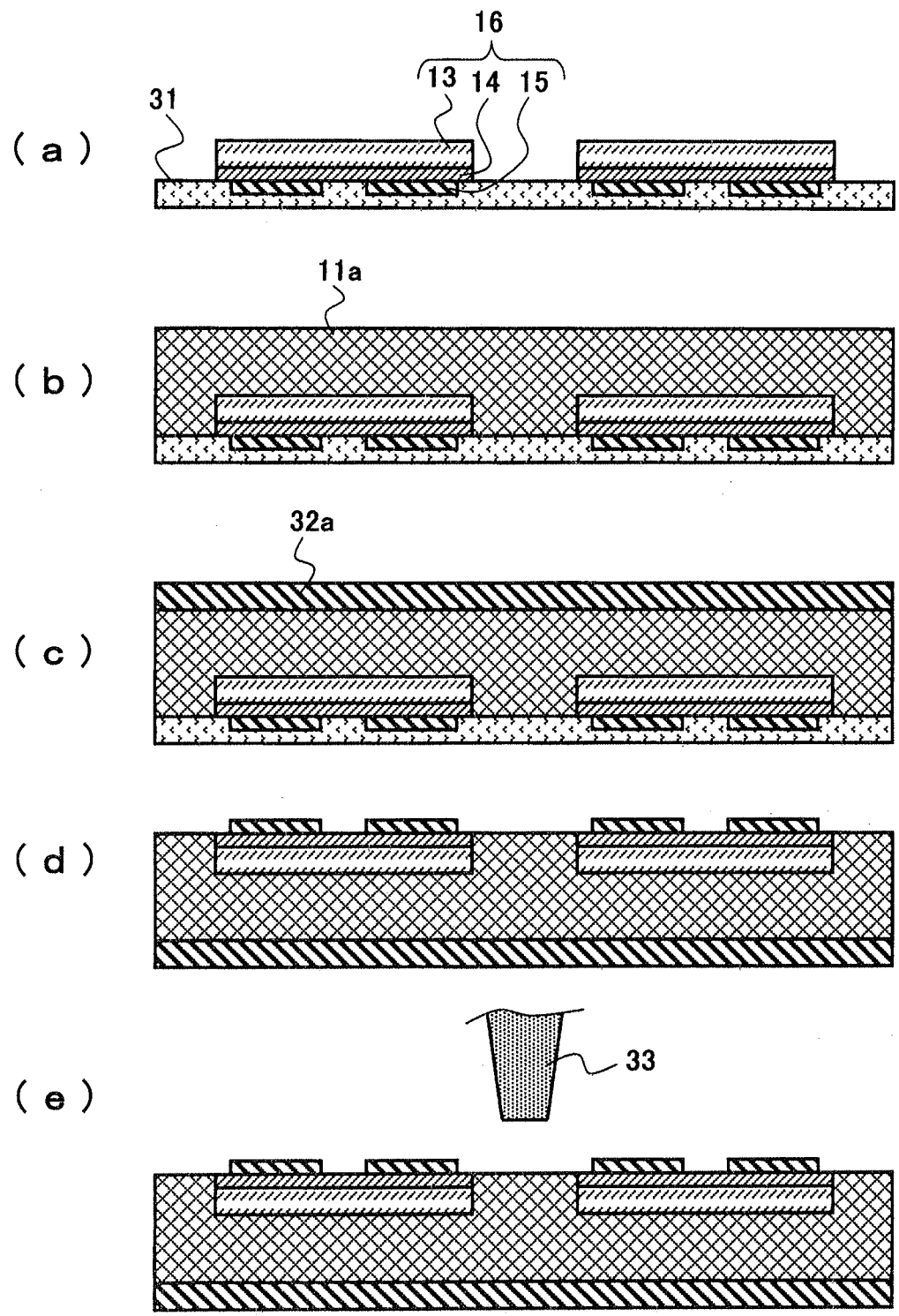
FIG. 3 is a diagram (1) for explaining the manufacturing process of the LED device 10 shown in FIG. 1.
Figure 4:
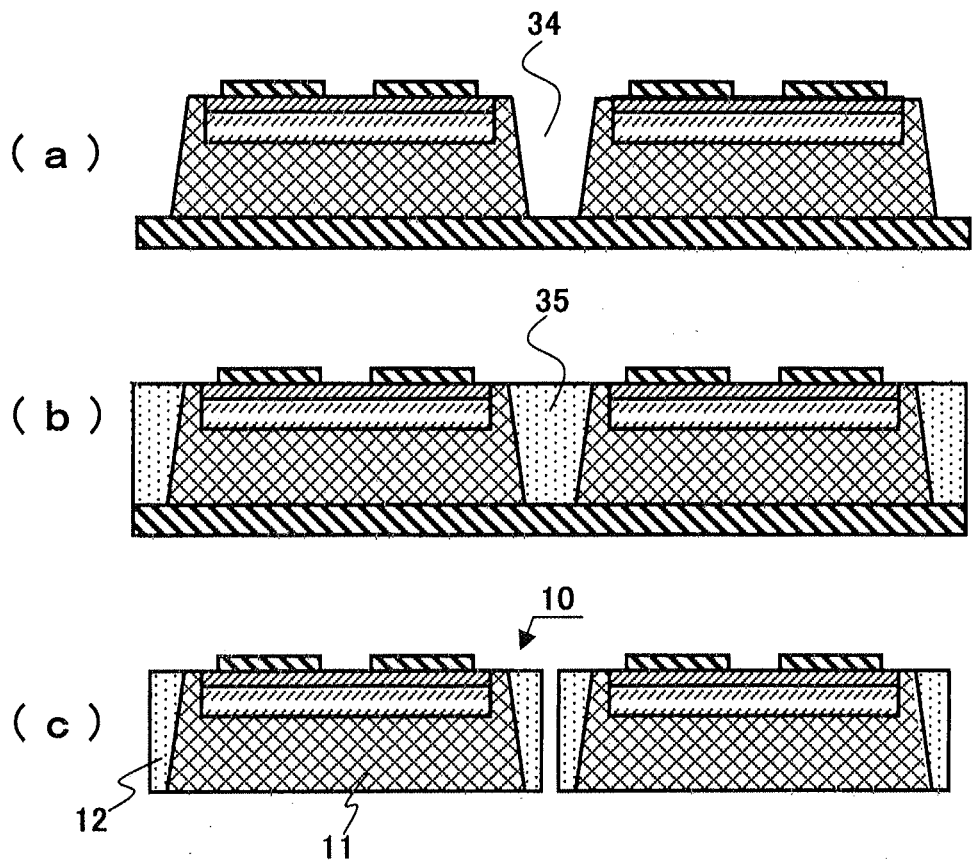
FIG. 4 is a diagram (2) for explaining the manufacturing process of the LED device 10 shown in FIG. 1.

FIGS. 3 and 4 are diagrams for explaining the manufacturing process of the LED device 10.

The manufacturing process shown in FIGS. 3 and 4 employs the batch manufacturing method in which various kinds of processing are performed on a structure containing a large number of LED dies 16 placed at a prescribed pitch on a support sheet which is eventually diced to separate each individual LED device 10. Several hundred to several thousand LED dies 16 are actually placed on the support sheet, but in FIGS. 3 and 4, only two LED dies 16 are shown.

In the placement step shown in FIG. 3(a), a large number of LED dies 16 are placed on a first support sheet 31. Each LED die 16 is placed with its external connecting electrodes 15 face down on the first support sheet 31. The LED dies 16 may be placed one by one on the first support sheet 31 by a picker or the like. Alternatively, a plurality of LED dies 16 may first be placed on some other suitable adhesive sheet which may then be laminated to the first support sheet 31. An adhesive layer is formed over the first support sheet 31, and each LED die 16 is placed with its external connecting electrodes 15 sinking into the adhesive layer. In this way, not only the external connecting electrodes 15 but the bottom face of the LED die 16 is also placed in contact with the adhesive layer. Prior to the placement step, LED dies having prescribed light emission characteristics are selected in advance as the LED dies 16 to be placed so that desired color emission can be obtained.

In the phosphor member applying step shown in FIG. 3(b), a phosphor member 11a (the suffix "a" is attached to distinguish the member contained in the structure from the member contained in each individual LED device: the same applies hereinafter) is applied to cover the upper and side faces of the LED dies 16. To form the cover, a squeegee or a mold is used, as is well known. After covering the LED dies 16 with the phosphor member 11a, the phosphor member 11a is cured by heating.

In the groove forming step shown in FIGS. 3(c) to 4(a), first a second support sheet 32a is laminated onto the upper surface of the phosphor member 11a, as shown in FIG. 3(c). Next, the whole structure containing the large number of LED dies 16 is turned upside down, as shown in FIG. 3(d). Here, the first support sheet 31 is removed. Next, a V-shaped (wedge-shaped) blade 33 is set as shown in FIG. 3(e). Then, the blade 33 is applied from the bottom side of the LED dies 16 to cut a V-shaped groove 34 in the phosphor member 11a between the LED dies 16, as shown in FIG. 4(a).

In the reflective resin filling step shown in FIG. 4(b), a reflective resin 35 is filled into the groove 34. The reflective resin 35 is prepared by mixing and kneading fine reflective particles such as titanium oxide or alumina into a silicone resin, as earlier described, and an appropriate quantity of the reflective resin is dispensed using a dispenser to fill the groove uniformly by utilizing capillary action. After the filling is completed, the reflective resin 35 is cured by heating.

In the dicing step shown in FIG. 4(c), the reflective resin 35 is cut to separate the individual LED devices 10. A dicer is used for cutting. Instead, a wire may be used for cutting. The reflective frame 12 formed from the reflective resin 35 can serve the purpose of blocking light if it has a final thickness of 30 to 50 μm.

While the reflective frame 12 of the LED device 10 has been described above as being formed from a reflective resin, the material for the reflective frame 12 need not necessarily be limited to a reflective resin. For example, the reflective frame 12 may be formed from a metal cup. In this case, the bottom of the cup is opened so that the external connecting electrodes provided on the bottom face of the LED die 16 can be used. Even with the reflective frame 12 formed from such a metal cup, it is possible to obtain an LED device 10 that is compact in size, has a good light-emitting efficiency, and is capable of providing a confined light distribution.

However, forming the reflective frame 12 of the LED device 10 from a reflective resin offers various advantages. First, since the reflective frame formed from a reflective resin can be made thin, the overall size can be further reduced. Second, since the reflective frame can be formed by forming a groove, filling the reflective resin, and cutting the reflective resin, as shown in FIGS. 3 and 4, the manufacturing step is simplified compared with the cup-shaped reflective frame which needs a mold for forming. The reason that the reflective frame can be formed from a reflective resin in a simple manner is that the LED device 10 does not have a sub-mount substrate. Furthermore, since the groove can be formed by applying the V-shaped blade from the bottom side in the final step of the batch manufacturing process, the desired sloping face can be easily formed on the inner wall of the reflective frame 12.

While the LED device 10 is intended to be directly mounted on a mother substrate, the LED device 10 may be mounted on a sub-mount substrate which may then be mounted on a mother substrate. As earlier described, the LED device 10 can be used as a camera flash light source and can be used advantageously in lighting equipment that has directivity or lighting equipment capable of color matching. When a plurality of LED devices 10 are used to construct lighting equipment capable of color matching, the reflective frame enclosing each LED device 10 makes it difficult for unwanted light from adjacent LED devices to enter the LED device. Since this can avoid the situation where the color of emission of the LED device is shifted due to the light emitted from adjacent LED devices 10, the LED device of the invention is suitable for use as a light source in lighting equipment capable of color matching.

Figure 5:
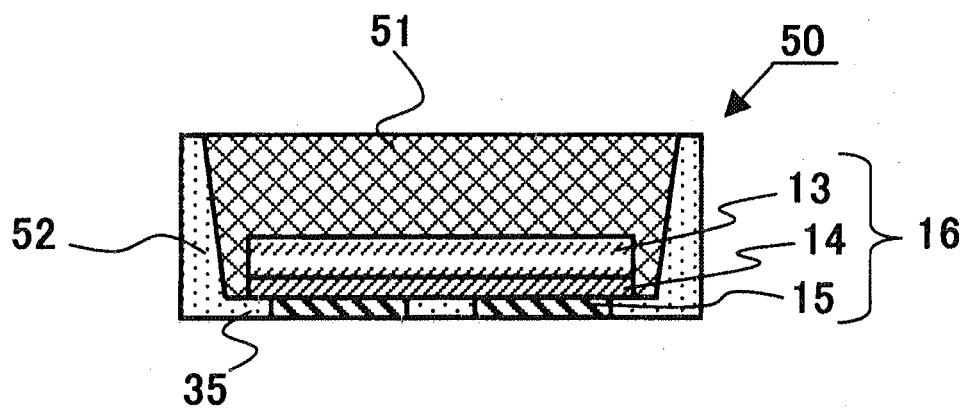
FIG. 5 is a cross-sectional view of an alternative LED device 50.

FIG. 5 is a cross-sectional view of an alternative LED device 50.

In the LED device 10 shown in FIGS. 1 to 4, the phosphor member 11 and the semiconductor layer 14 are both exposed in the bottom face of the LED device 10. By contrast, the LED device 50 shown in FIG. 5 is constructed so that neither the phosphor member 11 nor the semiconductor layer 14 is exposed in the bottom face. The reflective frame 52 of the LED device 50 is formed to cover not only the outer periphery thereof but also the bottom face of the LED die 16 except the regions where the external connecting electrodes 15 are formed. In FIG. 5, the reflective resin 35 as the material for the reflective frame 52 is also shown. The phosphor member 51 is disposed inside the reflective frame 52 and covers the upper and side faces of the LED die 16. The inner wall of the reflective frame 52 is sloped in the same manner as the reflective frame 12 of the LED device 10. The phosphor member 51 and the reflective frame 52 are respectively formed from the same materials as those used to form the phosphor member 11 and the reflective frame 12 in the LED device 10.

The only difference between the LED device 50 shown in FIG. 5 and the LED device 10 shown in FIG. 2 is that, in the bottom of the LED device 50, the reflective resin 35 covers the phosphor member 11 and the semiconductor layer 14 except the portions where the external connecting electrodes 15 are formed. The LED device 50 can be manufactured by filling a slightly larger amount of reflective resin 35 in the reflective resin filling step of FIG. 4(b) and, after curing the reflective resin 35, polishing the upper surface of the reflective resin 35 to expose the external connecting electrodes 15. The presence of the reflective resin 35 on the bottom face of the LED device 50 serves to protect the semiconductor layer 14 from contamination on the bottom face. The presence of the reflective resin 35 on the bottom face of the LED device 50 further serves to block the light trying to leak through the peripheries of the bottom faces of the phosphor member 51 and the semiconductor layer 14. The sloping face of the reflective frame 52 is formed so as to be in contact with the phosphor member 51 so that the inside diameter of the reflective frame 52 (the distance between the left and right sides of the reflective frame 52) becomes larger from the lower side toward the upper side of the LED die 16.

Figure 6:
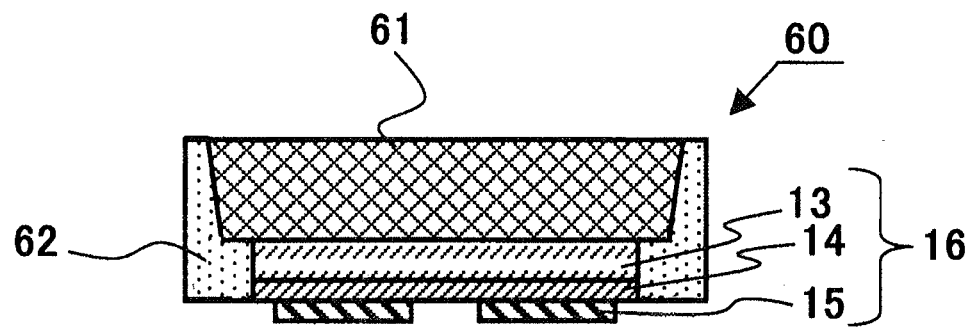
FIG. 6 is a cross-sectional view of another alternative LED device 60.

FIG. 6 is a cross-sectional view of another alternative LED device 60.

In each of the LED devices 10 and 50 shown in FIGS. 2 and 5, the phosphor member 11, 51 is provided so as to separate the side faces of the LED die 16 from the reflective frame 12, 52. However, in the LED device, the phosphor member may not be interposed between the reflective frame and the side faces of the LED die 16. Therefore, in the LED device 60 shown in FIG. 6, the reflective frame 62 is formed so as to be in contact with the side faces of the LED die 16.

In the LED device 60 shown in FIG. 6, the reflective frame 62 formed around the outer periphery is formed so as to be in contact with the side faces of the LED die 16. The inner wall of the reflective frame 62 is provided with a planar portion in addition to a sloping face, and the planar portion covers the side face of the LED die 16. The phosphor member 61 is disposed inside the reflective frame 62 and covers the upper face of the LED die 16. The phosphor member 61 and the reflective frame 62 are respectively formed from the same materials as those used to form the phosphor members 11 and 51 and the reflective frames 12 and 52 in the LED devices 10 and 50.

In the LED device 60, the phosphor member applying step shown in FIG. 3(b) is partly modified, and the LED die 16 is covered with the reflective resin as well as the phosphor member. First, the reflective resin (the same material as the reflective resin 35) is filled between the respective LED dies 16 so as to cover the side faces of the LED dies 16, and then the resin is cured. After that, the phosphor member (the same material as the phosphor member 11a) is applied to cover the upper faces of the LED dies 16. The subsequent groove forming, reflective resin filling, and dicing steps are the same as those shown in FIGS. 3(c) to 4(c).

In the LED device 60, since the side faces are in contact with the reflective frame 62, the light trying to emerge from the side faces of the sapphire substrate 13 is reflected back into the sapphire substrate 13. Since the light reflected back into the sapphire substrate 13 is attenuated due to reflection loss or by being reabsorbed by the semiconductor layer 14, the light emission efficiency of the LED device 60 is lower than that of the LED devices 10 and 50. However, since, of the components of the light produced by the phosphors in the phosphor member 61, those scattered toward the sides are reflected upward by the sloping face of the reflective member 62, the light emission efficiency is higher than it would be if it were not for the sloping face. The sloping face of the reflective frame 62 is formed so as to be in contact with the phosphor member 61 so that the inside diameter of the reflective frame 61 (the distance between the left and right sides of the reflective frame 61) becomes larger from the lower side toward the upper side of the LED die 16.

In the phosphor member applying step corresponding to FIG. 3(b), the side faces of the LED die 16 of the LED device 60 is completely covered with the reflective resin. Accordingly, if the amount of filling of the reflective resin 35 is insufficient in the later reflective resin filling step corresponding to FIG. 4(b), there is no possibility of light leaking from the side faces of the LED die 16. That is, the LED device 60 has the advantage that the tolerance to the amount of reflective resin filling can be increased (a greater margin of error can be allowed for the amount of reflective resin filling) in the reflective resin filling step corresponding to FIG. 4(b).

Figure 7:
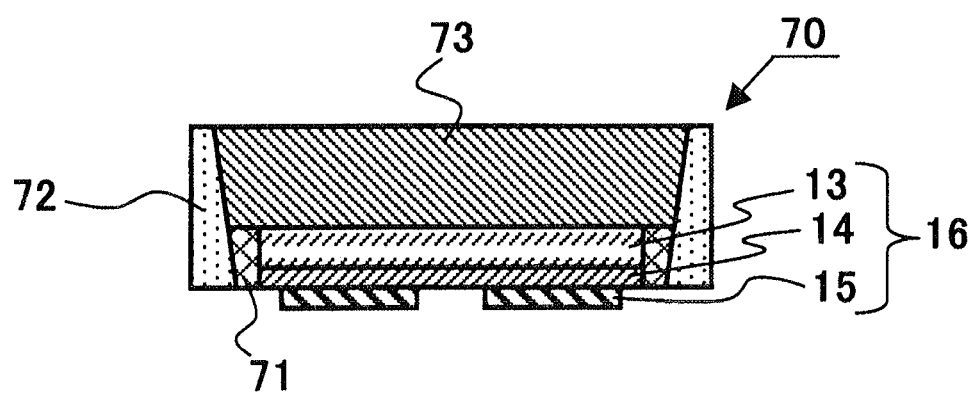
FIG. 7 is a cross-sectional view of a further alternative LED device 70.

FIG. 7 is a cross-sectional view of a further alternative LED device 70.

In each of the LED devices 10, 50, and 60 shown in FIGS. 2, 5 and 6, the upper face of the LED die 16 is covered with the phosphor member 11, 51, 61. More specifically, as described with reference to the phosphor member applying step shown in FIG. 3(b), the phosphor member 11, 51, 61 before curing is applied to cover the upper and side faces of the LED die 16, and after that, the phosphor member 11, 51, 61 is cured. However, the upper face of the LED die 16 may be covered with a phosphor sheet cured (or semi-cured) in advance. Therefore, in the LED device 70 shown in FIG. 7, the upper face of the LED die 16 is covered with a phosphor sheet 73 (a first phosphor member).

As in the LED device 10 shown in FIG. 2, the reflective frame 72 of the LED device 70 is formed around the outer periphery, and its inner wall is formed as a sloping face. The phosphor sheet 73 is attached to the upper face of the LED die 16, and the side face of the phosphor sheet 73 is in contact with the sloping face of the reflective frame 72. A phosphor member 71 (a second phosphor member) is interposed between the reflective frame 72 and the side faces of the LED die 16. In this way, two phosphor members are used in the LED device 70. As previously described with reference to FIG. 2, if providing the function of increasing the light emission efficiency is a major consideration, the phosphor member 71 may be replaced by a transparent member (optically transmissive member). The sloping face of the reflective frame 72 is formed so as to be in contact with the phosphor member 71 as well as the phosphor sheet 73 so that the inside diameter of the reflective frame 72 (the distance between the left and right sides of the reflective frame 72) becomes larger from the lower side toward the upper side of the LED die 16.

The phosphor member 71 and the reflective frame 72 are respectively formed from the same materials as those used to form the phosphor members 11, 51, and 61 and the reflective frames 12, 52, and 62 in the LED devices 10, 50, and 60. The phosphor sheet 73 is formed by mixing fine phosphor particles into a phenyl-based silicone resin and kneading the mixture into the shape of a sheet, and has a thickness of about 100 to 300 µm. If it is desired to reduce loss due to concentration quenching, the phosphor sheet 73 may be formed thicker.

As will be described later, the LED device 70 has the effect of simplifying the manufacturing process and facilitating the manufacturing. Furthermore, in the case of the LED device 70, since the phosphor sheet 73 can be manufactured at low cost, and its wavelength conversion characteristics can be adjusted easily, a set of phosphor sheets having different wavelength conversion characteristics may be prepared in advance, and the phosphor sheet 73 that matches the light emission characteristics of the LED die 16 may be selected as desired from the set. This makes it easy to manage the color of emission of the LED device 70.

Figure 8:
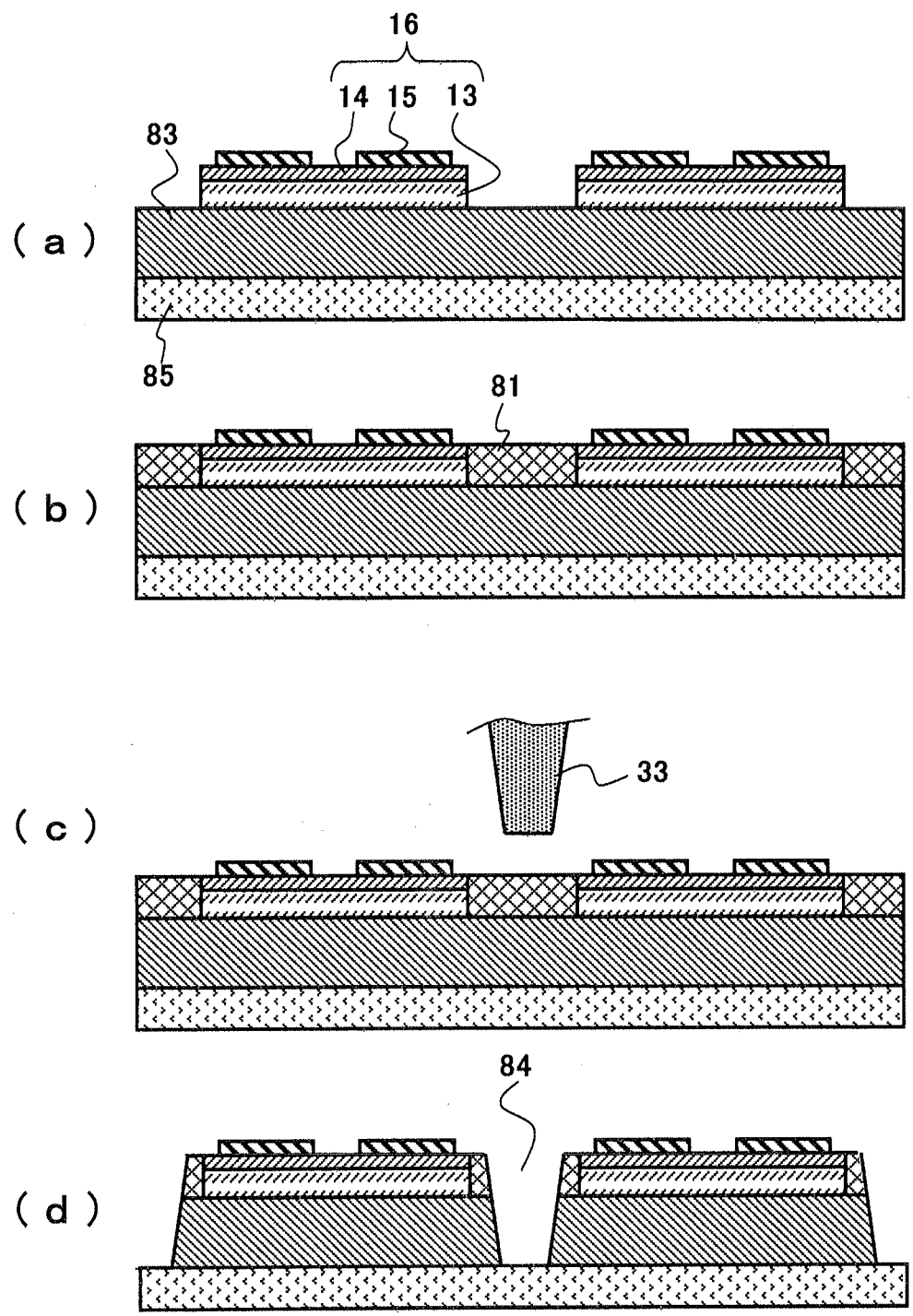
FIG. 8 is a diagram (1) for explaining the manufacturing process of the LED device 70 shown in FIG. 7.
Figure 9:
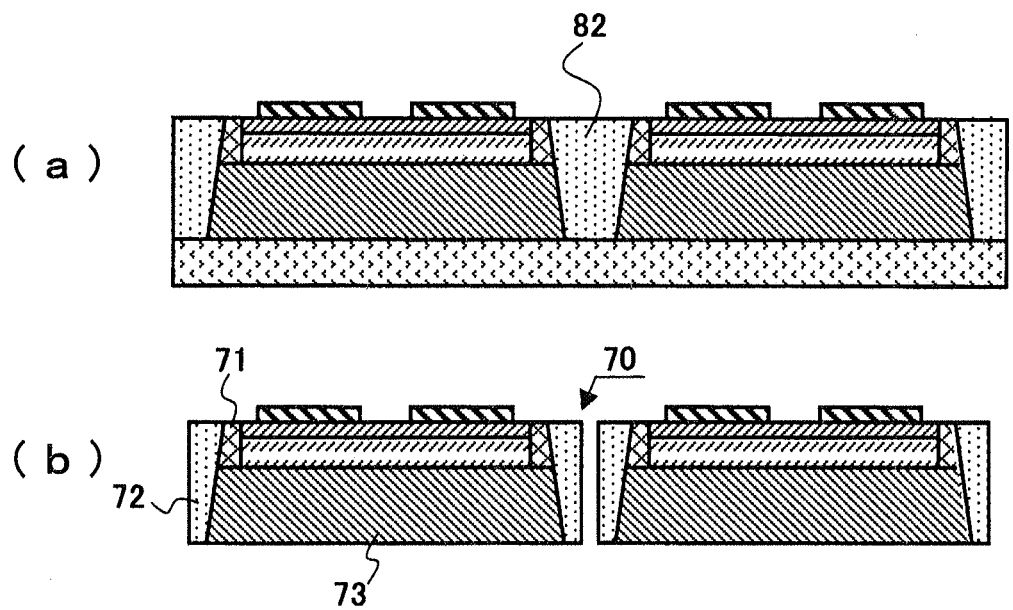
FIG. 9 is a diagram (2) for explaining the manufacturing process of the LED device 70 shown in FIG. 7.

FIGS. 8 and 9 are diagrams for explaining the manufacturing process of the LED device 70.

The entire manufacturing process shown here employs the batch manufacturing method in which various kinds of processing are performed on a structure containing a large number of LED dies 16 arranged on a large-sized phosphor sheet 83 which is eventually diced to separate each individual LED device 70. Several hundred to several thousand LED dies 16 are actually attached to the large-sized phosphor sheet 83, but in FIGS. 8 and 9, only two LED dies 16 are shown. The large-sized phosphor sheet 83 is diced into a large number of phosphor sheets 73. Since the processing in each of the steps shown in FIGS. 8 and 9 is performed only on one side of the large-sized phosphor sheet 83 by making use of gravity, each diagram is shown upside-down from that depicted in FIG. 7.

In the placement step shown in FIG. 8(a), the large-sized phosphor sheet 83 and the LED dies 16 are prepared, and the LED dies 16, each with its sapphire substrate 13 facing down, are bonded at a prescribed pitch onto the large-sized phosphor sheet 83. Each LED device 16 is chosen to have light emission characteristics that match the wavelength conversion characteristics of the large-sized phosphor sheet 83 in order to achieve desired color emission (or the large-sized phosphor sheet 83 is selected that matches the LED dies 16 chosen to have substantially identical light emission characteristics). An adhesive material not shown is applied to the large-sized phosphor sheet 83. The adhesive material can be applied by printing to the portions where the LED dies 16 are to be bonded. Alternatively, the adhesive material may be applied to the sapphire substrate 13 of each LED die 16. In that case, when the LED die 16 is picked up by a picker (or a sorter), the adhesive material is applied to the LED die 16 which is then bonded to the large-sized phosphor sheet 83. A support sheet 85 is attached to the underside of the large-sized phosphor sheet 83.

When bonding the LED dies 16 with their sapphire substrates 13 face down onto the large-sized phosphor sheet 83, the LED dies 16 may be placed one by one on the large-sized phosphor sheet 83 by a picker or the like. Alternatively, the plurality of LED dies 16 may first be placed on some other suitable adhesive sheet which may then be laminated to the large-sized phosphor sheet 83. After the LED dies 16 have been placed on the large-sized phosphor sheet 83, the adhesive material is cured by heating. The curing of the adhesive material here may be tentative curing in which the crosslinking is incomplete.

In the optically transmissive member filling step shown in FIG. 8(b), a phosphor member 81 (another phosphor member), which is different from the phosphor sheet 73 (the first phosphor member), is filled into the gap between the LED dies 16. The phosphor member 81 is filled into the gap between the respective side faces of the LED dies 16, and after that, the phosphor member 81 is cured by heating. Prior to the filling, a dam member not shown is formed so as to surround the outer periphery of the large-sized phosphor sheet 83 though not shown here, and the accurately measured phosphor resin 81 before curing is dispensed using a dispenser.

In the groove forming step shown in FIGS. 8(c) and 8(d), first a V-shaped blade 33 is set as shown in FIG. 8(c). Then, the V-shaped blade 33 is applied from the phosphor member 81 side toward the large-size phosphor support sheet 85 to cut a V-shaped groove 84 through the phosphor member 81 and phosphor sheet 83 between the LED dies 16, as shown in FIG. 8(d). The V-shaped blade 33 used here is the same as the blade 33 shown in FIG. 3(e).

In the reflective resin filling step shown in FIG. 9(a), a reflective resin 82 is filled into the groove 84. The reflective resin 82 is prepared by mixing and kneading fine reflective particles into a silicone resin, as earlier described, and an appropriate quantity of the reflective resin is dispensed using a dispenser to fill the groove uniformly by utilizing capillary action. After the filling is completed, the reflective resin 35 is cured by heating.

The bottom face of the LED die 61 may be covered with the reflective resin 82, as in the LED device 50 shown in FIG. 5. This can be achieved by applying a slightly larger amount of reflective resin 82 and, after curing the reflective resin 82, polishing the upper surface of the reflective resin 82 to expose the external connecting electrodes 15. This structure serves not only to protect the semiconductor layer 14 from contamination on the bottom face of the LED device 70 but also to block the light trying to leak through the peripheries of the bottom faces of the phosphor member 71 and the semiconductor layer 14.

In the dicing step shown in FIG. 9(b), the reflective resin 82 is cut to separate the individual LED devices 70. A dicer is used for cutting. Instead of the dicer, a wire may be used to cut the reflective resin 82. The reflective frame 72 formed from the reflective resin 82 can serve the purpose of blocking light if it has a final thickness of 30 to 50 μm.

As has been described above, the manufacturing process shown in FIGS. 8 and 9 differs from the manufacturing process shown in FIGS. 3 and 4 in that the large-sized phosphor sheet 83 as the first phosphor member is also used as the support sheet on which the LED dies 16 are placed. As a result, the manufacturing process shown in FIGS. 8 and 9 is simplified, compared with the manufacturing process shown in FIGS. 3 and 4. Further, in the manufacturing process shown in FIGS. 8 and 9, since the wavelength conversion characteristics of the large-sized phosphor sheet 83 and the light emission characteristics of the LED dies 16 can be adjusted in advance, it is easy to manage the color of emission of the LED device 70.

Figure 10:
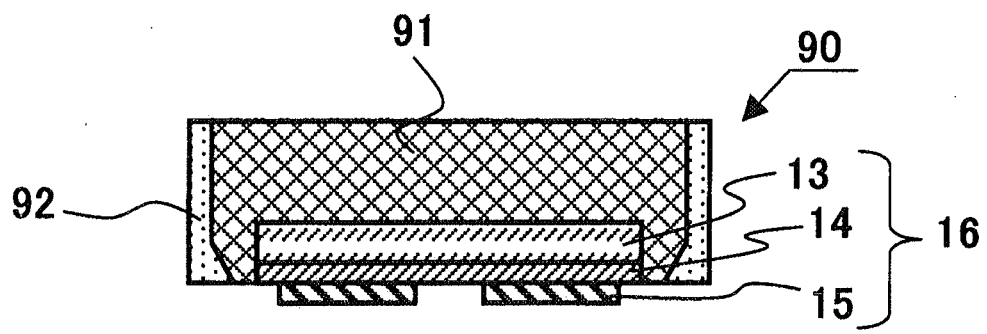
FIG. 10 is a cross-sectional view of a still further alternative LED device 90.

FIG. 10 is a cross-sectional view of a still further alternative LED device 90.

In the LED device 10 shown in FIG. 2, the reflective frame 12 has a sloping face extending from the top to the bottom. On the other hand, the reflective frame 62 of the LED device 60 shown in FIG. 6 has a sloping face only in the upper portion thereof. That is, if an LED device is to be obtained that is compact in size and that has a good light-emitting efficiency while achieving a confined light distribution, it is preferable to form the reflective frame so as to have a sloping face in a portion thereof. In view of this, the LED device 90 shown in FIGS. 10 to 12 is constructed so that the reflective frame 92 has a sloping face in the lower portion thereof.

The LED device 90 includes the reflective frame 92 formed around the outer periphery, the LED die 16, and a phosphor member 91 for wavelength-converting the light emitted from the LED die 16. The LED die 16 is the same as the LED die 16 shown in FIG. 2, and the reflective frame 92 and the phosphor member 91 are respectively formed from the same materials as those used to form the reflective frame 12 and the phosphor member 11, etc., shown in FIG. 2, etc. The sloping face of the reflective frame 92 is formed so as to be in contact with the phosphor member 91 so that the inside diameter of the reflective frame 92 (the distance between the left and right sides of the reflective frame 92) becomes larger from the lower side toward the upper side of the LED die 16.

As can be seen from a comparison between the LED device 90 and the LED device 10 shown in FIG. 2, the reflective frame 92 of the LED device 90 differs in cross-sectional shape from the reflective frame 12 of the LED device 10. The inner wall of the reflective frame 92 of the LED device 90 has in its upper portion a face formed perpendicular to the bottom face of the LED die 16 and a sloping face in its lower portion. The blue light emitted from the side face of the sapphire substrate 13 is reflected upward by the sloping face. A portion of the blue light is directed upward while being wavelength-converted on the way, and emerges from the upper face of the LED device 90.

Figure 11:
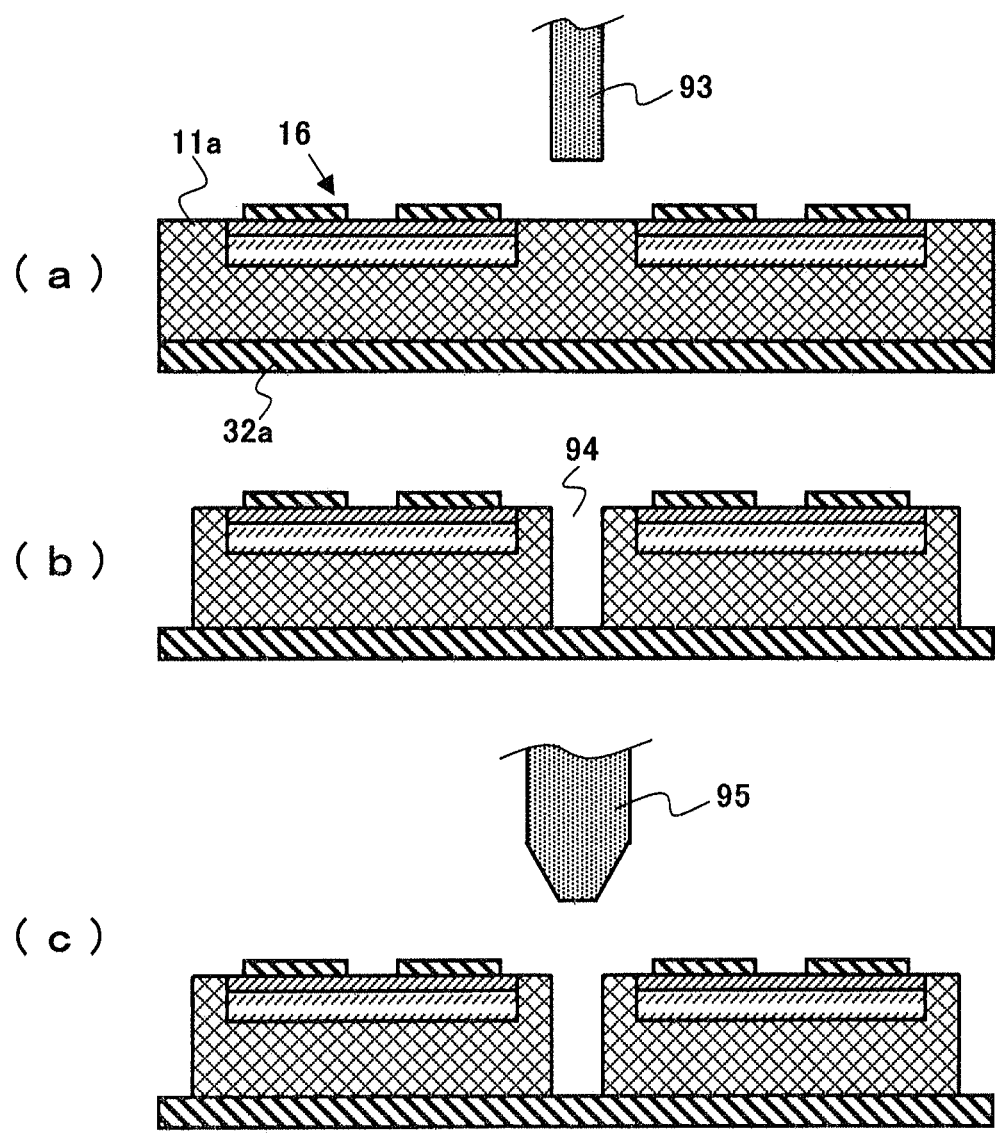
FIG. 11 is a diagram (1) for explaining the manufacturing process of the LED device 90 shown in FIG. 10.
Figure 12:
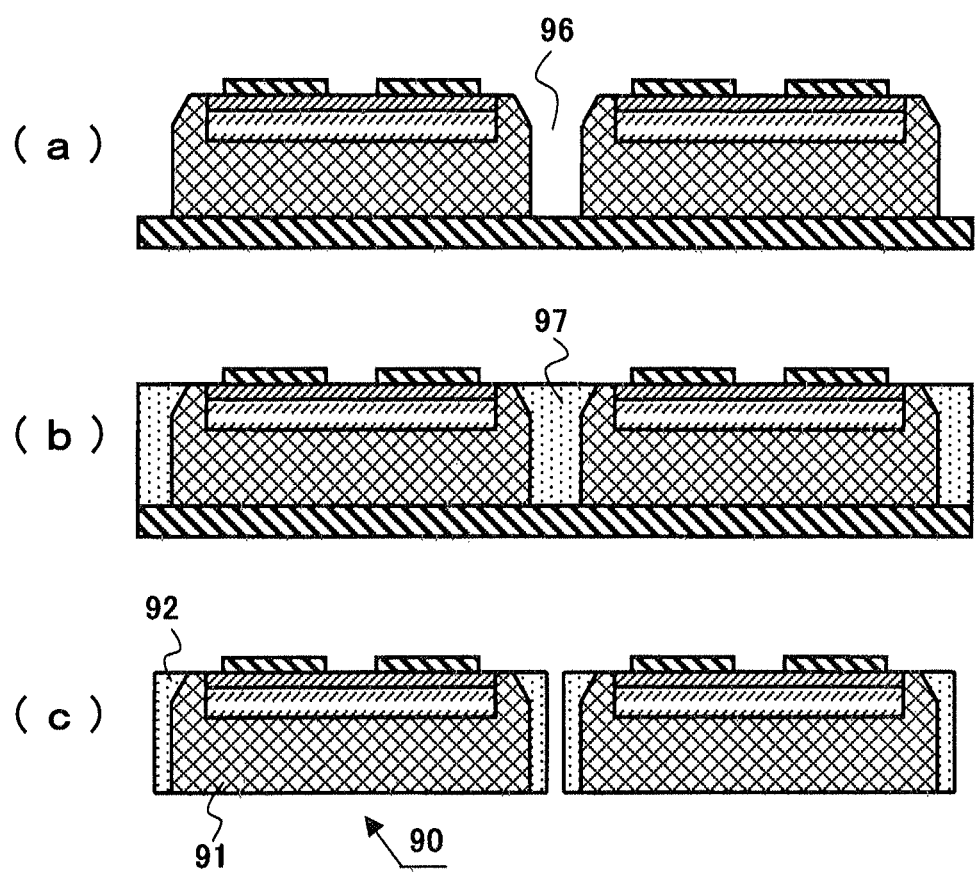
FIG. 12 is a diagram (2) for explaining the manufacturing process of the LED device 90 shown in FIG. 10.
Figure 13:
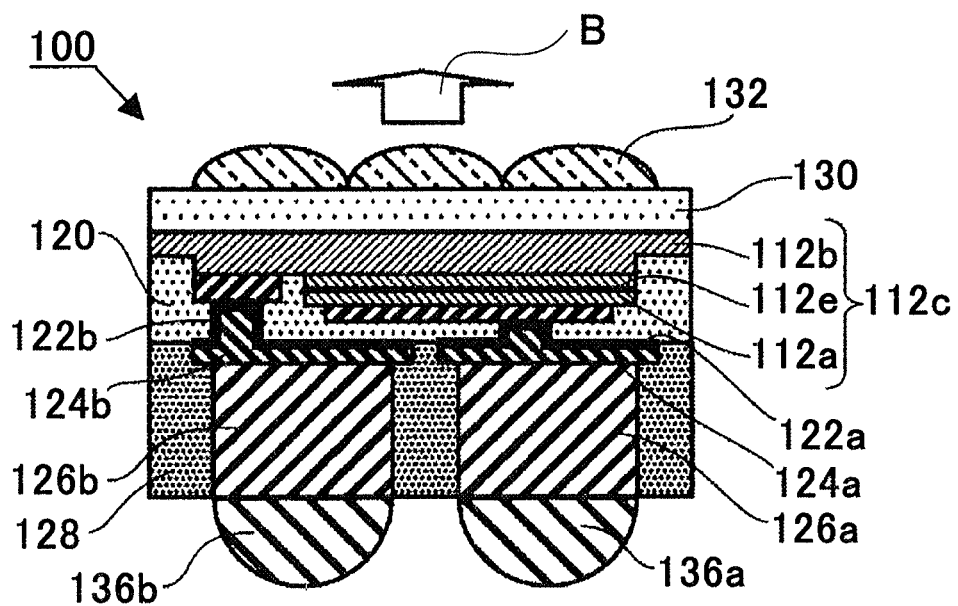
FIG. 13 is a cross-sectional view of an LED device 100 according to a first prior art example.
Figure 14:
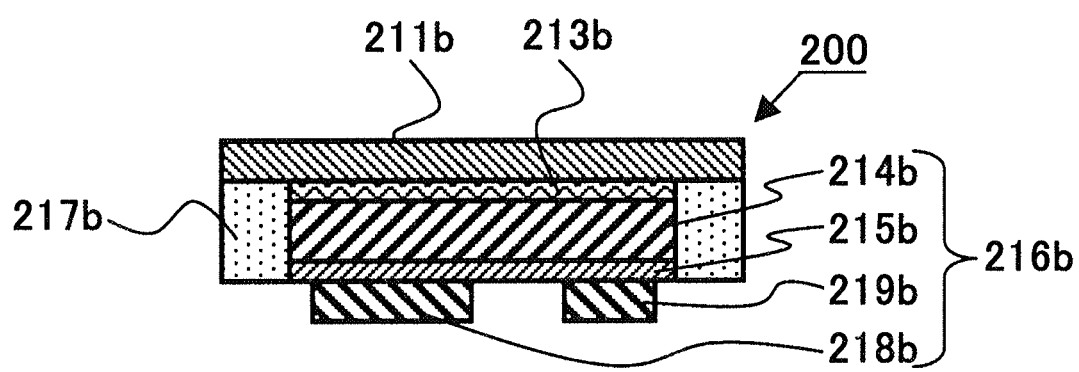
FIG. 14 is a cross-sectional view of an LED device 200 according to a second prior art example.

FIGS. 11 and 12 are diagrams for explaining the manufacturing process of the LED device 90.

In the manufacturing process of the LED device 90, the placement step for placing the LED dies 16 on the support sheet and the phosphor member applying step for applying the phosphor member 11a to cover the upper and side faces of the LED dies 16 are the same as the corresponding manufacturing steps of the LED device 10 shown in FIGS. 3(a) and 3(b), and therefore, these manufacturing steps will not be further described herein. Further, the step of laminating the second support sheet onto the upper surface of the phosphor member 11a, the step of removing the first support sheet, and the step of turning upside down the structure containing the large number of LED dies 16 connected by the phosphor member 11a, which constitute the preparatory stage of the groove forming step, are the same as the corresponding manufacturing steps of the LED device 10 shown in FIGS. 3(c) and 3(d), and therefore, these manufacturing steps will not be further described herein.

The groove forming step of the LED device 90 will be described with reference to FIGS. 11(a) to 12(a). After setting the structure containing the large number of LED dies 16, as earlier described, a flat plate blade 93 is set as shown in FIG. 11(a). Then, the blade 93 is applied from the bottom side of the LED dies 16 to cut a groove 94 having a rectangular cross section in the phosphor member 11a between the LED dies 16, as shown in FIG. 11(b). Next, a blade 95 having a V-shaped end is set as shown in FIG. 11(c). Then, the blade 95 is pressed to form sloping faces at the bottom (upward in the figure) of the groove 94, as shown in FIG. 12(a), completing the formation of a groove 96.

In the reflective resin filling step shown in FIG. 12(b), a reflective resin 97 is filled into the groove 96. The reflective resin 97 is prepared by mixing and kneading fine reflective particles such as titanium oxide or alumina into a silicone resin; then, in the same manner as in FIG. 4(b), an appropriate quantity of the reflective resin is dispensed using a dispenser to fill the groove uniformly by utilizing capillary action. After the filling is completed, the reflective resin 97 is cured by heating.

In the dicing step shown in FIG. 12(c), the reflective resin 97 is cut to separate the individual LED devices 97 in the same manner as in FIG. 4(c). A dicer is used for cutting. Instead of the dicer, a wire may be used to cut the reflective resin 97. The reflective frame 92 formed from the reflective resin 97 can serve the purpose of blocking light if it has a final thickness of 30 to 50 μm.

The groove 94 having the rectangular cross section may be formed using a wire or mold instead of the blade 93. The bottom face of the LED die 61 in the LED device 90 may be covered with the reflective resin 97, as in the LED device 50 shown in FIG. 5. Further, a portion of the phosphor member 91 in the LED device 90 may be replaced by a phosphor sheet, as in the LED device 70 shown in FIG. 7. When using a phosphor sheet, the structure containing a large number of LED dies 16 is manufactured in accordance with the manufacturing steps shown in FIG. 8, and after that, the structure is subjected to the manufacturing steps shown in FIGS. 11 and 12.

DESCRIPTION OF THE REFERENCE NUMERALS 10, 50, 60, 70, 90 . . . LED DEVICE
11, 11a, 51, 61, 71, 81, 91 . . . PHOSPHOR MEMBER
12, 52, 62, 72, 92 . . . REFLECTIVE FRAME

13 ... SAPPHIRE SUBSTRATE (TRANSPARENT INSULATING SUBSTRATE)
14 ... SEMICONDUCTOR LAYER
15 ... EXTERNAL CONNECTING ELECTRODE
16 ... LED DIE
31, 32a, 85 ... SUPPORT SHEET
33, 93, 95 ... BLADE
35, 82, 97 ... REFLECTIVE RESIN
34, 84, 94, 96 ... GROOVE
73 ... PHOSPHOR SHEET
83 ... LARGE-SIZED PHOSPHOR SHEET

What is claimed is:

1. A method for manufacturing an LED device having a reflective frame formed around an outer periphery thereof, an LED die, and a phosphor member for wavelength-converting of light emitted from said LED die, the method comprising:
   a placement step for placing said LED die on a first support sheet in such a manner that an external connecting electrode provided on a lower side of said LED die faces down;
   a phosphor member applying step for applying said phosphor member so as to cover upper and side faces of said LED die;
   a groove forming step comprising bonding a second support sheet to an upper surface of said phosphor member on an upper side of said LED die and for forming a groove for separating said LED die by applying a V-shaped blade from a bottom side of said phosphor member;
   a reflective resin filling step for filling a reflective resin into said groove; and
   a dicing step for dicing to separate said LED device by cutting said reflective resin.

2. The LED device manufacturing method according to claim 1, wherein in said groove forming step, first a groove having a rectangular cross section is formed in said phosphor member, and then said V-shaped blade is applied from the bottom side of said phosphor member to form a sloping face on a portion of said rectangular cross-section groove, thereby forming a groove that has a sloping face on said bottom side.

3. A method for manufacturing an LED device having a reflective frame formed around an outer periphery thereof, an LED die, and a phosphor member for wavelength-converting of light emitted from said LED die, the method comprising:
   a placement step for placing said LED die on a large-sized phosphor sheet in such a manner that an external connecting electrode provided on a lower side of said LED die faces down;
   an optically transmissive member filling step for filling an optically transmissive member or a phosphor member different from said phosphor sheet into a gap separating said LED die;
   a groove forming step for forming a groove for separating said LED die by applying a V-shaped blade so as to cut through said optically transmissive member or said phosphor member different from said phosphor sheet until reaching said phosphor sheet;
   a reflective resin filling step for filling a reflective resin into said groove; and
   a dicing step for dicing to separate said LED device by cutting said reflective resin.

* * * * *